(12) United States Patent
Cremer et al.

(10) Patent No.: US 8,853,760 B2
(45) Date of Patent: Oct. 7, 2014

(54) INTEGRATED CIRCUIT WITH PROTECTION FROM COPPER EXTRUSION

(75) Inventors: Sébastien Cremer, Sassenage (FR); Sébastien Gaillard, Saint Martin d'Heres (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 188 days.

(21) Appl. No.: 13/292,392

(22) Filed: Nov. 9, 2011

(65) Prior Publication Data

US 2012/0112259 A1 May 10, 2012

(30) Foreign Application Priority Data

Nov. 10, 2010 (FR) .................................... 10 59295

(51) Int. Cl.
| | |
|---|---|
| H01L 27/108 | (2006.01) |
| H01L 49/02 | (2006.01) |
| H01L 21/768 | (2006.01) |
| H01L 23/532 | (2006.01) |
| H01L 23/522 | (2006.01) |
| H01L 27/02 | (2006.01) |

(52) U.S. Cl.
CPC ........... H01L 28/75 (2013.01); *H01L 21/76895* (2013.01); *H01L 23/53238* (2013.01); *H01L 23/5226* (2013.01); *H01L 27/0207* (2013.01); H01L 27/10814 (2013.01); H01L 27/10855 (2013.01)
USPC ............ 257/296; 257/E27.084; 257/E21.008; 438/381

(58) Field of Classification Search
CPC .............. H01L 27/10852; H01L 28/91; H01L 27/0207; H01L 27/10888; H01L 21/76897; H01L 27/10814; H01L 27/10855; H01L 23/5223
USPC .................. 257/532, E29.002, E29.008, 306, 257/E21.011, E21.019, E21.648, E27.087, 257/296, 301, 303, E27.092, E21.649, 257/E27.086; 438/381, 396, 243, 386, 695, 438/241

See application file for complete search history.

(56) References Cited

U.S. PATENT DOCUMENTS

| | | | | |
|---|---|---|---|---|
| 6,605,837 | B2 * | 8/2003 | Schwarzl | 257/296 |
| 7,312,535 | B2 * | 12/2007 | Takewaki et al. | 257/786 |
| 7,759,768 | B2 * | 7/2010 | Barth et al. | 257/532 |
| 7,999,330 | B2 * | 8/2011 | Hu | 257/383 |
| 8,659,064 | B2 * | 2/2014 | Hu | 257/301 |
| 2001/0028588 | A1 | 10/2001 | Yamada et al. | 365/210 |
| 2003/0025143 | A1 * | 2/2003 | Lin et al. | 257/303 |
| 2005/0082586 | A1 | 4/2005 | Tu et al. | 257/296 |
| 2005/0161765 | A1 * | 7/2005 | Tsau | 257/528 |
| 2006/0292786 | A1 * | 12/2006 | Hu | 438/238 |
| 2007/0262417 | A1 | 11/2007 | Ohtake et al. | 257/532 |
| 2009/0085156 | A1 * | 4/2009 | Dewey et al. | 257/532 |
| 2010/0129978 | A1 * | 5/2010 | Kim | 438/393 |
| 2012/0012914 | A1 * | 1/2012 | Hu | 257/306 |
| 2013/0271938 | A1 * | 10/2013 | Lindert et al. | 361/782 |

* cited by examiner

*Primary Examiner* — Stephen W Smoot
*Assistant Examiner* — Edward Chin
(74) *Attorney, Agent, or Firm* — Allen, Dyer, Doppelt, Milbrath & Gilchrist, P.A.

(57) ABSTRACT

An integrated circuit may include an element placed in an insulating region adjacent to a copper metallization level and including a barrier layer in contact with a metallization level. The element may be electrically connected to and spaced away from a copper line of the metallization level by way of an electrical link passing through the barrier layer and including an electrically conductive material different from copper in direct contact with the copper line.

19 Claims, 4 Drawing Sheets

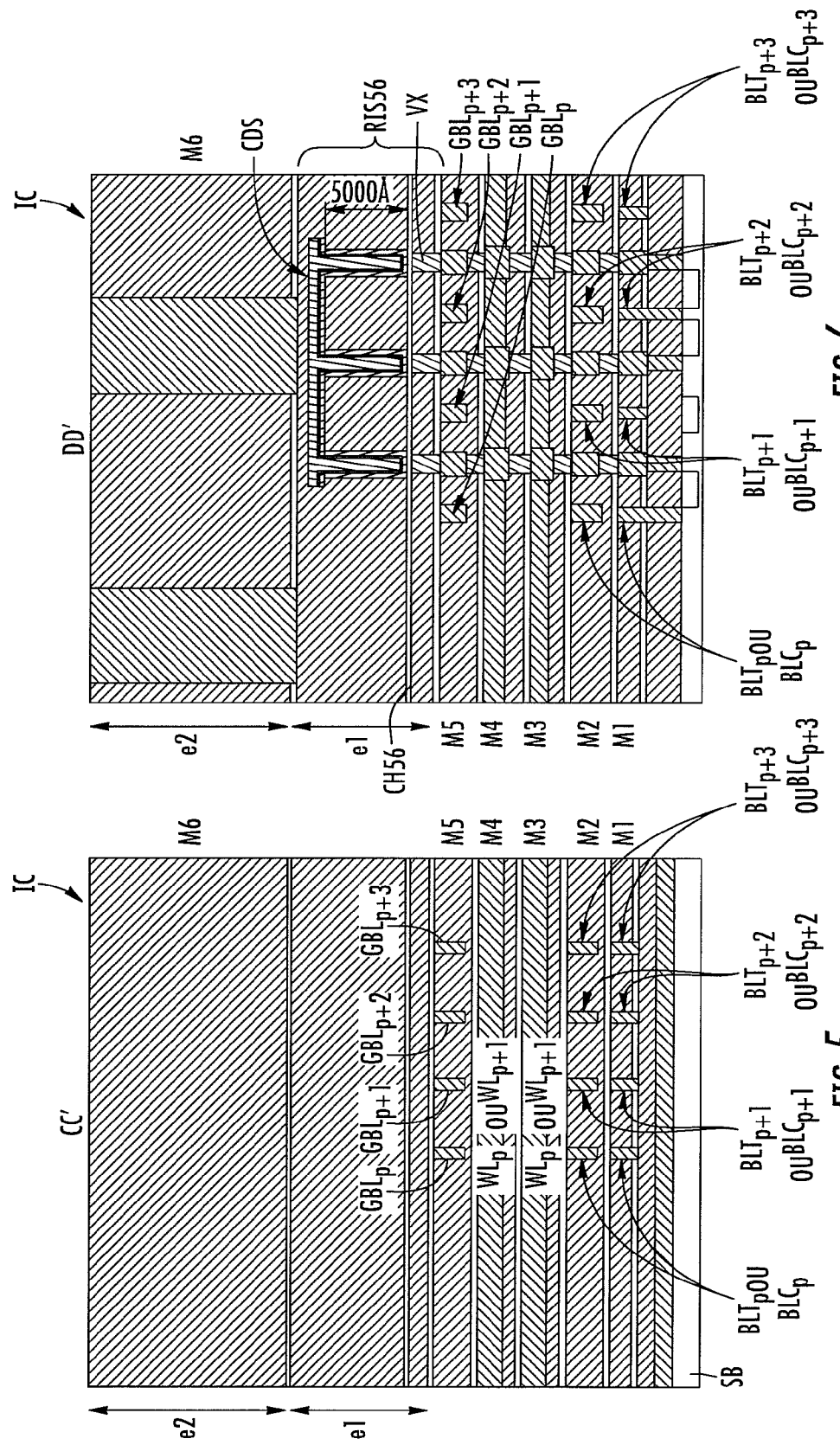

INTEGRATED CIRCUIT WITH PROTECTION FROM COPPER EXTRUSION

FIELD OF THE INVENTION

The present disclosure relates to the field of integrated circuits (ICs), more particularly, to ICs comprising a capacitor incorporated into a dynamic random access memory (DRAM), and to the protection of certain elements, such as capacitors, from copper extrusions coming from metal lines.

BACKGROUND OF THE INVENTION

The capacitors used in DRAM memory cells are three-dimensional capacitors located in an insulating region of an integrated circuit. This insulating region is adjacent to a metallization level, generally made of copper, and at least one electrode of these capacitors is connected to a copper line of this metallization level. The copper metallization level includes a certain number of copper lines close to the bottom electrodes of the capacitors. The density of the metallization level grows with more advanced fabrication technology. Thus, with, for example, 32 nm fabrication technology, the space between the copper lines of the metallization level is reduced. Short circuits may appear between the bottom electrodes of the capacitors and the metal lines located close to the capacitors.

These ICs also include barrier layers, for example, made of silicon nitride (SiN) or SiCN, placed between the metallization levels and the various insulating regions. The aim of these barrier layers is to prevent copper from diffusing into the insulating regions.

The bottom and top electrodes of the capacitors generally comprise a layer of titanium nitride. During the atomic layer deposition step for forming the titanium nitride layers, very high temperatures (above 400° C.) are reached. These temperatures promote a reaction between the copper of the metal lines and the silicon nitride barriers. The copper may react with the barriers and may be expelled from the line toward the capacitor. This extrusion of copper may cause failure of the capacitor.

SUMMARY OF THE INVENTION

According to one embodiment, it is proposed to reduce the failures within embedded capacitors, in particular, by preventing any copper extrusion, while still reducing the risk of short circuits between the capacitors and the copper lines of the metallization level.

According to one aspect, the present disclosure provides an IC comprising an element placed in an insulating region adjacent to a copper metallization level and including a barrier layer in contact with a metallization level. The element may be electrically connected to and spaced away from a copper line of the metallization level by an electrical link passing through the barrier layer and comprising an electrically conductive material different from copper in direct contact with the copper line.

Thus, the electrical link, which comprises an electrically conductive material different from copper, prevents reaction between the copper of the copper line and the barrier layer. The risk of copper extrusion may be reduced.

Furthermore, the electrical link enables the copper line to be spaced away from the element connected to this line, thereby, on the one hand, making it easier to place a material different from copper in direct contact with the copper line, despite the presence of the barrier layer, and, on the other hand, reducing the risk of short circuits between the element and the metal lines of the metallization level that are close to the copper line.

Advantageously, the element may comprise a metal-insulator-metal capacitor possessing an electrode electrically connected to and spaced away from the copper line using the electrical link. This being so, the present disclosure may be applied to any element in contact with a copper line. The capacitor may be a capacitor of a DRAM memory cell. In this regard, the capacitor may, for example, form part of an integrated memory device of the DRAM type, as described in French Patent Application No. 1050391, the content of which is hereby incorporated by reference in its entirety.

More precisely, according to one embodiment, such a DRAM memory device may comprise a memory cell, including a transistor possessing a first electrode, for example, the source, a second electrode, generally the drain, and a control electrode, for example, the gate, and a capacitor, for example, a three-dimensional capacitor forming the element and coupled to the first electrode via at least the electrical link and the copper line. The device may include at least a first electrically conductive line, generally called a "bit line," coupled to the second electrode, and at least a second electrically conductive line, generally called a "word line" coupled to the control electrode. The electrically conductive lines may be placed between the transistor and the capacitor.

In other words, according to this embodiment, the capacitor of the DRAM memory cell is located in the IC, relative to the transistor, higher than the bit line and the word line, this having the advantage of being able to produce the capacitor in inter-metal insulating regions of the IC that are relatively thick, and in any case thicker than the insulating regions encapsulating and separating the metallization levels in which the bit line or lines and the word line or lines are produced. Producing the capacitor in these thick insulating regions may make it easier for the capacitor to be spaced away from the copper line by way of the electrical link.

Furthermore, it is possible to produce a capacitor, preferably a three-dimensional capacitor, of relatively large size, therefore offering a high capacitive value, even when the memory cell is produced in an advanced technology, for example, in 32 nanometer technology, resulting in a reduction in footprint and therefore a high density of logic signals to be conveyed. Moreover, the word line or lines and the bit line or lines may be produced in bottom metal levels using a standard process.

According to one embodiment, the memory device may comprise a matrix of DRAM memory cells, a set of first electrically conductive lines coupled to the second electrode of the transistors of the memory cells, and a set of second electrically conductive lines coupled to the control electrodes of the transistors of the memory cells. Both these sets of lines may be produced respectively within different metal levels, and the capacitors of the memory cells may be produced above both these sets of electrically conductive lines.

According to another embodiment, the memory device may further comprise a set of additional electrically conductive lines or global bit lines. These global bit lines may be produced in at least one metal level located above those containing the sets of first and second lines. The capacitors of the memory cells may be respectively connected to and at a higher level than copper lines produced in the same level as the electrically conductive global bit lines. In other words, in such an embodiment, the global bit lines may be produced above the bit lines and the word lines, and the capacitors may be at a higher level than the metal level of the global bit lines.

Thus, there may be a reduced risk of a short circuit between the global bit lines and the capacitors.

BRIEF DESCRIPTION OF THE DRAWINGS

FIGS. 2 to 6 are cross-sectional views of another embodiment of the IC, according to the present invention.

DETAILED DESCRIPTION OF THE PREFERRED EMBODIMENTS

Figure 1:
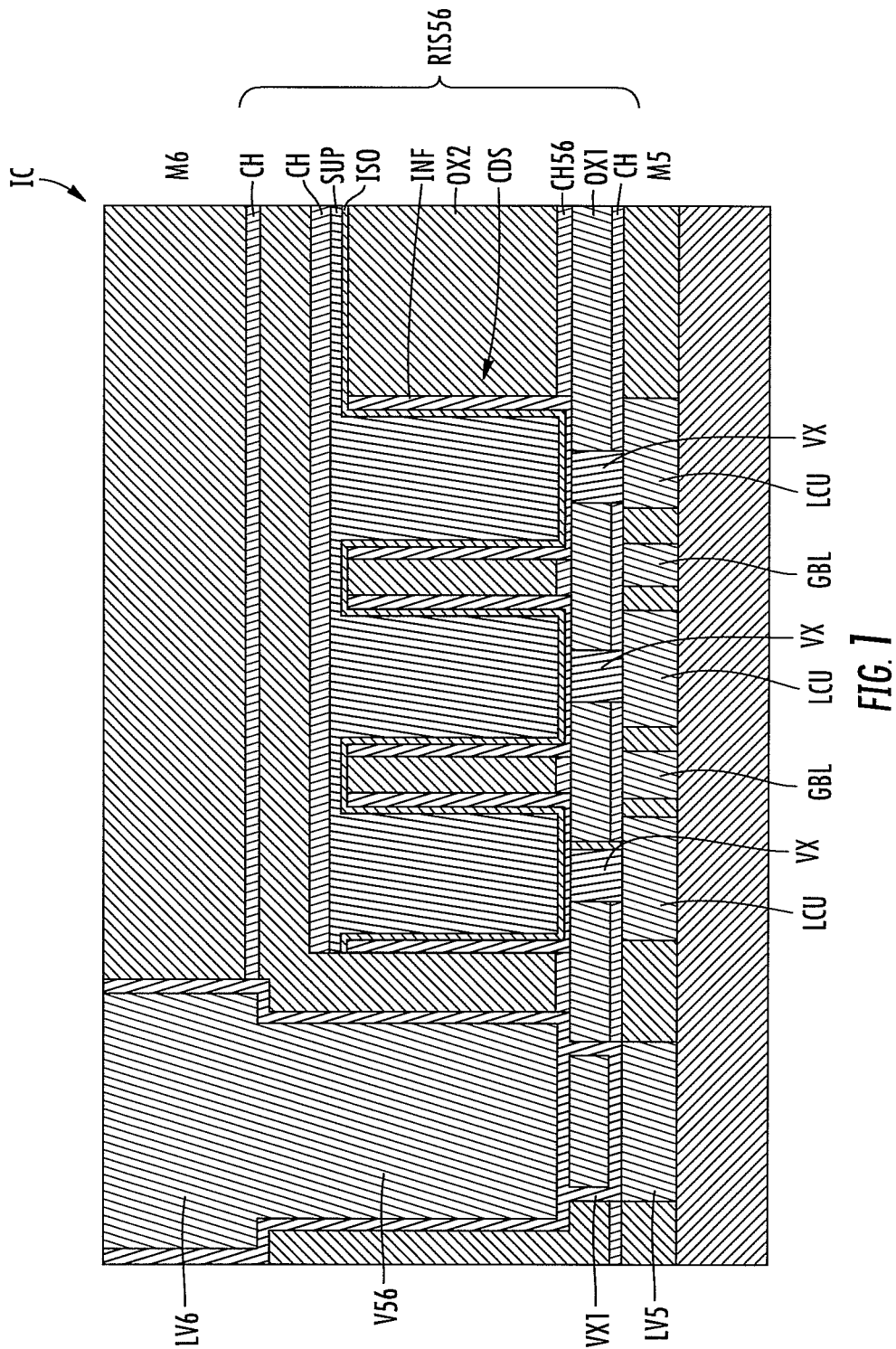
FIG. 1 is a cross-sectional view of an embodiment of an IC, according to the present invention.

FIG. 1 is a sectional view of an integrated circuit IC comprising capacitors CDS (three in number). The capacitors CDS are produced within an insulating region RIS56 located above a metallization level M5, for example, the fifth metallization level of the integrated circuit IC. Another metallization level M6 is located above the insulating region RIS56, for example, the sixth metallization level of the integrated circuit IC.

The two metallization levels M5 and M6 may comprise a number of copper metal lines. The insulating region comprises different insulating materials, and especially silicon dioxide OX2. The insulating region also includes a barrier layer CH placed in contact with the metallization level M5. This barrier layer CH generally comprises silicon nitride (SiN) or SiCN.

Each capacitor CDS is a three-dimensional metal-insulator-metal capacitor comprising a bottom electrode INF, an insulator ISO, and a top electrode SUP. The two electrodes INF and SUP each comprises a layer of titanium nitride (TiN). The insulator ISO may comprise, for example, a layer of zirconium oxide ($ZrO_2$). The top electrode SUP is, for example, covered with a layer of silicon nitride (SiN).

The bottom electrode INF of each capacitor is connected to a copper line LCU of the metallization level M5 by way of an electrical link VX containing an electrically conductive material different from copper, in direct contact with the copper line LOU. In this example, the electrical link VX, which is a pad, is made in a silicon dioxide layer OX1 separated from the silicon dioxide layer OX2 by a silicon nitride layer CH56. Any electrically conductive material different from copper is suitable.

The conductive material of the pad VX may, for example, be chosen from the group comprised of tantalum nitride (TaN), tungsten (W) and titanium nitride (TiN). Advantageously, the conductive material is tantalum nitride (TaN), which offers good performance as a copper diffusion barrier. The electrical link VX passes through the barrier layer CH so as to contact the subjacent copper line LOU directly.

Pad VX is formed by using conventional fabrication steps, namely for example etching, deposition of TaN and chemical-mechanical polishing (CMP). Depending on the size of the pad VX, this may be formed completely by the electrically conductive material, as illustrated in FIG. 1. As a variant, when the size of the pad is larger, the fabrication process then comprises, for example, the deposition of a layer of TaN followed by deposition of copper and chemical-mechanical polishing.

In other words, in this case, the copper of the link here is partially encapsulated in a layer of electrically conductive material different from copper, for example, TaN. This encapsulation is, for example, illustrated on the link VX1 that connects a track LV5 of the metallization level M5 to the via V56 connected to a track LV6 of the metal level M6.

The track LV6 and the via V56 are produced during a damascene process in which a TaN layer forming a diffusion barrier is deposited before the deposition of copper. The copper of the link VX1 is completely encapsulated by the TaN and separated from the copper of the via V56 by the TaN layer deposited during the damascene process. Of course, such a wide electrical link with copper partially encapsulated in TaN may connect a capacitor CDS or else another element to a copper line LOU.

The metallization level M5 further comprises additional lines called global bit lines GBL. These lines are placed close to the capacitor CDS. The pads VX serve, on the one hand, to raise the capacitors relative to the metal level M5, thereby reducing the risk of a short circuit between the bottom electrodes of the capacitors and the lines GBL, and, on the other hand, prevent extrusion of copper from the lines LOU. The metallization levels M5 and M6 here are spaced apart sufficiently to allow each capacitor CDS to be at a higher level than the copper line LOU.

The capacitors CDS may form part of a DRAM memory device. Each memory cell may comprise a transistor and a capacitor CDS. The bottom electrode of a capacitor CDS may be connected to the source of this transistor, especially by way of the copper line LCU. The drain of this transistor may be connected to a bit line and its gate may be connected to a word line.

The memory device may comprise a matrix of DRAM memory cells comprising a set of bit lines and a set of word lines. Moreover, the additional lines GBL may be global bit lines. Such an embodiment corresponds to a DRAM memory device such as that described in French Patent Application No. 1050391, in which the capacitors are located above the word lines and above the bit lines, and even above the global bit lines.

Figure 2:
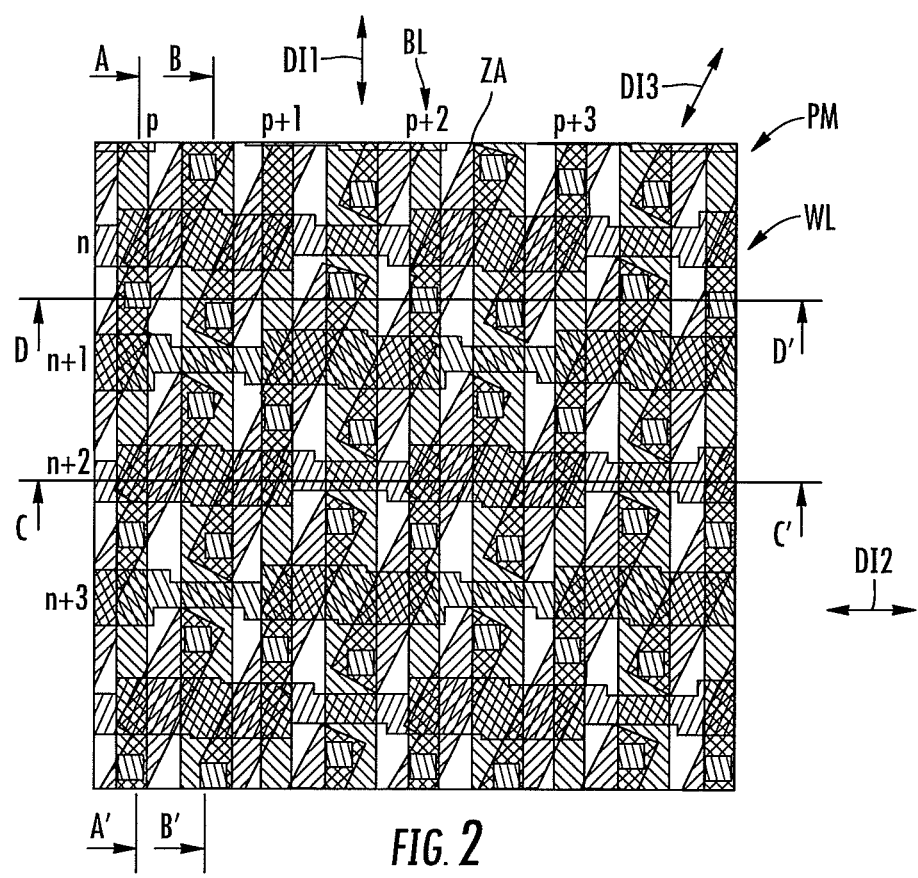
Figure 4:
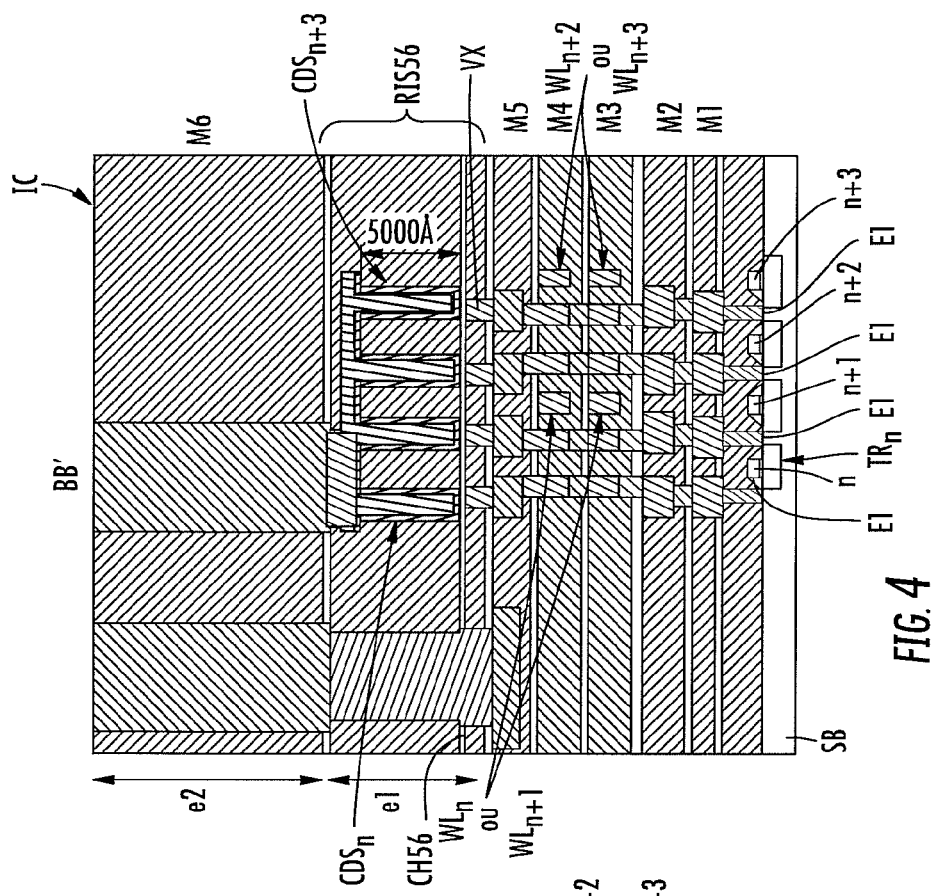
Figure 3:
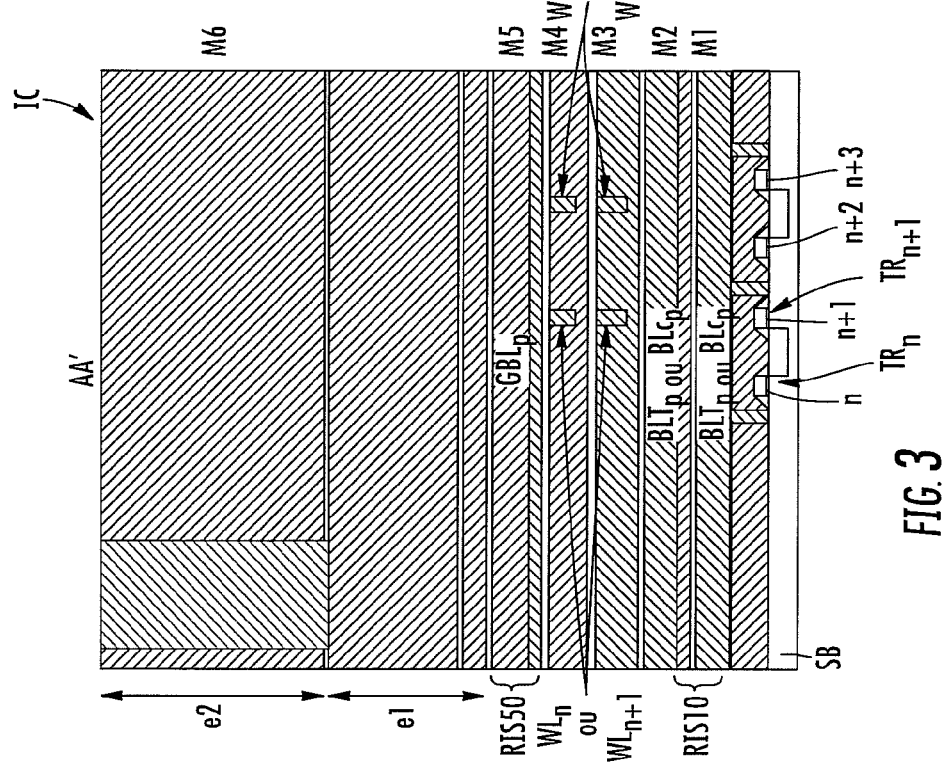

The main features of such an embodiment may now be recalled with reference to FIGS. 2 to 6. FIG. 2 shows an example of a partial layout of the memory cells of a memory plane PM. More precisely, the transistors of these memory cells comprise active zones ZA that are surmounted by polysilicon lines forming the gates of these transistors and that may be connected to word lines WL, that extend parallel to these polysilicon lines. Moreover, contacts are provided on the drains of the transistors so as to contact bit lines BL located at a metal level M1 (the lowest level) and are oriented in this example vertically, i.e. perpendicular to the word lines WL, which are themselves oriented horizontally.

Contacts are also provided on the sources of the transistors so as to be able to connect, by the stack of vias, portions of metal tracks and of links VX, the bottom electrodes of the capacitors CDS of the memory planes. This allows interconnection with the capacitors CDS, and FIG. 2 shows that the active zones of the transistors are oriented along an overall direction DI3 different from the orientation direction DI1 of the bit lines and from the orientation direction DI2 of the word lines.

In this example, the direction DI3 is oblique to the directions DI1 et DI2. Nevertheless, other configurations are possible. Thus, it may be possible for the active zones of the transistors to be oriented generally vertically, the word lines horizontally and the bit lines obliquely.

FIGS. 3 to 6 schematically illustrate cross sections on the lines A-A', B-B', C-C' and D-D' of FIG. 2 respectively. As is typical in this field, an integrated circuit comprises, above the active elements produced in a substrate SB, for example, transistors, an interconnect part usually referred to by those skilled in the art as the "BEOL" (back end of line). This interconnect part comprises metal levels within which metal tracks are produced for interconnection between the various logic elements of the integrated circuit. These metal tracks are mutually separated within one and the same metal level by inter-track dielectric material and two adjacent metal levels are also mutually separated by one or more inter-level dielectric materials.

The insulating regions RIS10-RIS50 within which the metal levels M1, M2, M3, M4 and M5 are produced respectively, are relatively fine and typically have a thickness of around 2000 angstroms in 32 nanometer technology. In fact, the metal levels M1-M5 serve in the integrated circuit for routing the logic signals.

However, above the metal level M5, the insulating region RIS56 that separates the metal level M5 from the metal level M6 is thicker than the insulating regions RIS10-RIS50. Typically, in 32 nanometer technology, the thickness e1 of such a region RIS56 is around 6000 angstroms. Moreover, the thickness e2 of the metal level M6 itself is around 8000 angstroms, whereas the thickness of the metal levels M1-M5 is around 1150 angstroms.

Several capacitors CDS are shown in FIGS. 3 to 6. The top electrode of each capacitor is common, while the bottom electrodes are separate. The common top electrode of the capacitors CDS is connected to a metal track of the metal level M6 whereas each bottom electrode of the capacitors CDS is connected to the electrode E1 of the transistors TRi by way of a stack of vias and portions of metal tracks.

These vias and metal tracks, which form the various bit lines, word lines and global bit lines, are produced typically in a standard process for producing the BEOL part of the integrated circuit. Such a process comprises, in particular, the deposition of dielectric layers, the formation of cavities in these layers, and the filling of these cavities with one or more metals.

Moreover, the capacitors CDS are placed above all the bit lines, word lines, and global bit lines, thereby making it possible to produce these capacitors in thick insulating regions, for example, the insulating region RIS56. This arrangement also makes it possible, as may be seen below, to raise the capacitors CDS relative to the metal level M5.

Thus, by way of indication, as illustrated in FIGS. 3 to 6, the height of each capacitor may be around 5000 angstroms. For the sake of simplification, FIGS. 3 to 6 show in general the set of bit lines by the references BLT and BLC and the word lines by the references $WL_i$.

Moreover, on account of the interlaced and superposed architecture of the bit lines and word lines, the various tracks shown may either be a bit line BLT or a bit line BLC, or else a word line assigned to a cell n or a word line assigned to an adjacent cell. Finally, the set of additional electrically conductive lines, i.e. the global bit lines, are referenced by the reference GBL, $GBL_{p+1}$, $GBL_{p+2}$ and $GBL_{p+3}$. These FIGS. 3 to 6 clearly show a superposed structure of bit lines and word lines.

Moreover, a global bit line is superposed on a bit line, and the bottom electrodes of the capacitors are connected to the source of the transistors by the stacks of vias and metal track portions that extend between the bit lines and the word lines. It may be noted that the capacitors CDS are raised relative to the subjacent metal level M5 within which the global bit lines are produced.

This raising of the capacitor CDS is achieved, for example, by way of auxiliary metal vias VX such as those described with reference to FIG. 1, provided in a silicon oxide layer separate from the silicon oxide layer in which the capacitors are produced by the silicon nitride layer CH56.

According to another aspect of the invention, the electrical link VX can have a thickness of more than 100 nanometers. For example, the thickness of the barrier layer CH may be 30 nanometers, and the thickness of the silicon dioxide layer may be 100 nanometers. The use of a thick silicon dioxide layer allows for, for example, raising the capacitor CDS further away from the subjacent metal level M5. Furthermore, silicon dioxide has a lower electrical permittivity than silicon nitride. The use of a silicon dioxide layer in addition to the barrier layer allows for, for example, raising the capacitor while limiting parasitic capacitive coupling. Other insulating materials may also replace the silicon dioxide layer OX1, for example, materials with a low electrical permittivity (or low-k dielectrics).

That which is claimed is:

1. An integrated circuit (IC) comprising:
   an insulating region;
   a copper metallization layer comprising a copper line;
   an electrical element in said insulating region, and being adjacent to said copper metallization layer and spaced apart from said copper line;
   a multi-layer barrier layer adjacent said copper metallization layer and preventing any direct physical contact between said electrical element and said copper metallization layer;
   an electrical link electrically coupling said electrical element to said copper line of said copper metallization layer and passing through said multi-layer barrier layer, said electrical link comprising an electrically conductive material different from copper and being in contact with said copper line.

2. The IC according to claim 1 wherein said electrical element comprises a metal-insulator-metal capacitor having an electrode electrically coupled to and spaced apart from said copper line by said electrical link.

3. The IC according to claim 2 wherein said metal-insulator-metal capacitor comprises a dynamic random access memory (DRAM) memory cell capacitor.

4. The IC according to claim 1 wherein the electrically conductive material comprises at least one of tantalum nitride, tungsten, and titanium nitride.

5. The IC according to claim 1 wherein the electrically conductive material comprises tantalum nitride.

6. The IC according to claim 1 wherein said electrical link comprises a copper inner portion, and a layer of the electrically conductive material at least partially encapsulated said copper inner portion.

7. The IC according to claim 1 further comprising a DRAM memory device comprising at least one memory cell, said at least one memory cell comprising:
   a transistor having a first electrode, a second electrode, and a control electrode;
   said electrical element comprising a capacitor coupled to said first electrode via at least said electrical link and said copper line;
   at least one first electrically conductive line coupled to said second electrode; and
   at least one second electrically conductive line coupled to said control electrode, said at least one first and second electrically conductive lines being placed between said transistor and said capacitor.

8. The IC according to claim 7 wherein said at least one memory cell comprises a plurality thereof; wherein said at least one first electrically conductive line comprises a plurality thereof respectively coupled to said second electrode of said transistors of said plurality of memory cells; wherein said at least one second electrically conductive line comprises a plurality thereof respectively coupled to said control electrodes of said transistors of said plurality of memory cells; wherein both said pluralities of first and second electrically conductive lines are provided respectively within different metal layers; and wherein said capacitors of said plurality of memory cells are provided over both pluralities of first and second electrically conductive lines.

9. The IC according to claim 8 wherein said DRAM memory device further comprises a plurality of third electrically conductive lines provided in said copper metallization layer, said capacitors of said plurality of memory cells being respectively coupled to and being at a higher layer than said copper lines produced in the same layer as said plurality of third electrically conductive lines.

10. The IC according to claim 1 wherein said electrical link has a thickness greater than 100 nanometers.

11. The IC according to claim 1 wherein said multi-layer barrier layer comprises a first silicon nitride layer, an oxide layer over said first silicon nitride layer, and a second silicon nitride layer over said oxide layer.

12. The IC according to claim 11 wherein the electrically conductive material comprises tantalum nitride.

13. An integrated circuit (IC) comprising:
an insulating region;
a copper metallization layer;
an electrical element in said insulating region and adjacent to said copper metallization layer;
a multi-layer barrier layer being between said copper metallization layer and said electrical element and preventing any direct physical contact between said electrical element and said copper metallization layer; and
an electrical link electrically coupling said electrical element to said copper metallization layer and passing through said multi-layer barrier layer, said electrical link comprising an electrically conductive material different from copper and being in contact with said copper metallization layer.

14. The IC according to claim 13 wherein said electrical element comprises a metal-insulator-metal capacitor having an electrode electrically coupled to and spaced apart from said copper metallization layer by said electrical link.

15. The IC according to claim 14 wherein said metal-insulator-metal capacitor comprises a dynamic random access memory (DRAM) memory cell capacitor.

16. The IC according to claim 13 wherein the electrically conductive material comprises at least one of tantalum nitride, tungsten, and titanium nitride.

17. The IC according to claim 13 further comprising a DRAM memory device comprising at least one memory cell, said at least one memory cell comprising:
a transistor having a first electrode, a second electrode, and a control electrode;
said electrical element comprising a capacitor coupled to said first electrode via at least said electrical link and said copper metallization layer;
at least one first electrically conductive line coupled to said second electrode; and
at least one second electrically conductive line coupled to said control electrode, said at least one first and second electrically conductive lines being between said transistor and said capacitor.

18. The IC according to claim 13 wherein said multi-layer barrier layer comprises a first silicon nitride layer, an oxide layer over said first silicon nitride layer, and a second silicon nitride layer over said oxide layer.

19. The IC according to claim 18 wherein the electrically conductive material comprises tantalum nitride.

* * * * *